United States Patent [19]

Hurwitt et al.

[11] Patent Number: 5,174,875
[45] Date of Patent: Dec. 29, 1992

[54] METHOD OF ENHANCING THE PERFORMANCE OF A MAGNETRON SPUTTERING TARGET

[75] Inventors: Steven D. Hurwitt, Park Ridge, N.J.; Arnold J. Aronson, Pomona; Charles Van Nutt, Monroe, both of N.Y.

[73] Assignee: Materials Research Corporation, Orangeburg, N.Y.

[21] Appl. No.: 814,320

[22] Filed: Dec. 23, 1991

Related U.S. Application Data

[63] Continuation of Ser. No. 575,561, Aug. 29, 1990, abandoned.

[51] Int. Cl.⁵ .............................................. C23C 14/35
[52] U.S. Cl. .......................... 204/192.12; 204/298.03; 204/298.17; 204/298.18; 204/298.19; 204/298.2
[58] Field of Search ........... 204/192.1, 192.12, 192.13, 204/298.02, 298.03, 298.16, 298.17, 298.18, 298.19, 298.2, 298.21, 298.22

[56] References Cited

U.S. PATENT DOCUMENTS

| 4,166,783 | 5/1979 | Turner . | |
|---|---|---|---|
| 4,275,126 | 6/1981 | Bergmann et al. | 204/298.2 X |
| 4,401,539 | 8/1983 | Abe et al. | 204/298.19 X |
| 4,500,408 | 2/1985 | Boys et al. | 204/298.19 X |
| 4,500,409 | 7/1985 | Boys et al. . | |
| 4,569,482 | 2/1986 | Hiruma et al. . | |
| 4,595,482 | 3/1986 | Mintz . | |
| 4,622,121 | 10/1986 | Wegmann et al. . | |
| 4,627,904 | 12/1986 | Mintz | 204/298.16 X |
| 4,734,183 | 4/1988 | Wirz et al. . | |
| 4,747,926 | 5/1988 | Shimizu et al. | 204/298.18 X |
| 4,956,070 | 9/1990 | Nakada et al. | 204/298.2 X |
| 4,957,605 | 9/1990 | Hurwitt et al. | 204/298.19 X |
| 4,964,968 | 5/1990 | Arita . | |

Primary Examiner—Nam X. Nguyen
Attorney, Agent, or Firm—Wood, Herron & Evans

[57] ABSTRACT

A plasma confining magnetic field is generated over the sputtering region of a sputtering target with a critical field line which determines the shape of the plasma. The critical field line is progressively flattened over the course of the life of the target as the target erodes. Preferably, the magnet is configured with poles spaced around the portion of the target below the sputtering region to provide a magnetic field that flattens as its strength decreases. A regulated power supply maintains a regulated power level that is increased as the target erodes to maintain a constant deposition rate. The voltage delivered by the power supply is maintained at or above a constant level by progressively decreasing the current to an electromagnet to progressively reduce the field strength and flatten the field. As a result of the invention, the erosion groove of the target is broadened and the number of wafers coated by the target during its life is increased.

12 Claims, 3 Drawing Sheets

WITHOUT INVENTION
FIG. 4A

WITH INVENTION
FIG. 4B

WITH INVENTION
FIG. 4C

METHOD OF ENHANCING THE PERFORMANCE OF A MAGNETRON SPUTTERING TARGET

This application is a continuation of application Ser. No. 07/575,561, filed Aug. 29, 1990 abandoned.

The present invention relates to methods for extending the use of cathode sputtering targets and more particularly to methods for controlling the energization of a cathode sputtering target over the course of its life to broaden the erosion area of the target and thereby increase the utilization of target material.

BACKGROUND OF THE INVENTION

Sputter coating is a process carried out in a vacuum chamber, filled with a generally chemically inert gas, in which a substrate to be coated is mounted facing a target formed of the coating material. In the chamber, the target is subjected to an electrical potential negative with respect to the chamber wall or some other anode within the chamber. The potential gradient adjacent the target surface causes electrons to be emitted from the target. As they are attracted toward the chamber anode, the emitted electrons strike and ionize some of the atoms of the inert gas by stripping electrons from them. Positive ions of the gas are thereby formed and attracted toward the negative target which they strike, transferring momentum to the target material, and ejecting particles of the material from the target surface. The substrate to be coated, which is positioned in the chamber usually with its surface facing the target so as to intercept the moving particles of coating material sputtered from the target, receives some of the ejected particles, which adhere to and coat the substrate surface.

In magnetron enhanced sputtering processes, a magnetic field is formed over the target surface with magnetic field lines having components extending parallel to the target surface. In many applications, the field lines arch over the target surface and form a closed magnetic tunnel. The magnetic field causes the electrons moving from the target to curve in spiral paths over regions of the target surface enclosed by the field, thereby increasing the electron density in the enclosed space, and resulting in an increase in the rate of electron collisions with gas atoms over the enclosed regions of the target surface. The increased collision rate in turn increases the ionization of the gas in the enclosed space and thus increases the efficiency of the sputtering process at the underlying target region. Where the magnetic field lines equal or exceed a critical field strength over the target surface, a glowing ion cloud or plasma is seen trapped within the field over the region of the target surface.

In the commonly assigned and copending U.S. patent application Ser. No. 07/339,308, filed Apr. 17, 1989, now U.S. Pat. No. 4,957,605, entitled "Method and Apparatus for Sputter Coating Stepped Wafers," expressly incorporated herein by reference, a sputter coating apparatus and method are disclosed in which a concave annular target is provided with a pair of concentric annular electromagnets with concentric pole pieces behind and at the rim of the target. The fields produced by these magnets cause the formation of a pair of concentric plasma rings overlying concentric sputtering regions on the target surface. The two plasma rings are alternately energized by alternately supplying current to the magnet coils while the target power is switched between to controlled power levels in synchronization with the switching of the current to the magnetic coils. This causes the two target regions to be alternately activated so that the sputtering from the regions is alternately switched on and off. This provides different controllable rates of sputtering from inner and outer concentric regions of the surface of a single piece sputtering target.

Separate control of the sputtering from the plural target regions enables the control of the distribution characteristics of the sputtered material deposited on the substrate or wafer being coated. For example, varying the relative parameters affecting the energization of the two target regions, as for example the "on" power levels or the duty cycle of the activation of each target region, provides control of coating uniformity on the substrate surfaces. This control is especially important where differently facing surfaces of substrates such as stepped semiconductor wafers must be uniformly coated. The aforereferenced patent application Ser. No. 07/339,308 particularly describes in detail certain effects on the coating uniformity caused by target and substrate geometry and by the electrical parameters relating to the energization of the target and the plasmas. The application also discusses the effects of target erosion on sputter coating uniformity.

By its very nature, the process of cathode sputter coating involves the removal of material from the sputtering target and the redeposition of the sputtered material onto the substrate surface. The removal of material from the cathode sputtering target consumes the target, reducing the thickness of the target until eventually an erosion groove or area will "punch through" to the back surface of the target. The erosion of the target surface is usually uneven, being concentrated in areas which underlie the denser regions of ion concentration or plasmas in the space above the target adjacent the target surface. To broaden the area of target erosion, some prior art devices have caused the plasma to move on the target surface, usually by movements made in magnetic fields. This movement of the plasma moves the area of erosion about the surface of the target reducing the tendency of a sharp erosion groove to be formed. Movement of the position of the plasmas, however, incapacitates, or at least complicates, the selective control of the sputtering rate from different target regions to achieve coating uniformity.

With magnetron sputtering devices, the plasmas are generally confined to one or more regions of a target surface, in part due to design requirements of the magnet structure, and in part due to certain performance requirements which necessitate the location of the plasmas in specific geometric positions in relation to the substrate surfaces to achieve a desired coating distribution on the substrate. For example, in U.S. patent application Ser. No. 07/339,308, expressly incorporated by reference above, the maintenance of separate plasmas on a target in specific geometric relationships with the substrate surface are employed in order to control the uniformity of the coating on a substrate surface, particularly where the surface of the substrate includes diversely facing surfaces such as steps on semiconductor wafers.

In the above-referenced patent application, the positions of the plasmas determine the locations from which the sputtering material is emitted, which determines the corresponding distribution of the deposited coating material on the substrate surface. By controlling the ratios of material emitted from different sputtering regions on a sputtering target, the uniformity of the coating is controllable. Accordingly, it is important that the location of the sputtering regions be located on the target in particular positions selected to provide the desired coating uniformity. Thus, the techniques devised by certain devices of the prior art for moving the plasmas about the target surface in order to redefine the areas of erosion throughout the life of the target interfere with the ability to freely achieve desired coating uniformity by precise placement of the plasma and, consequently, of the erosion region of the target.

Erosion of the target surface by the emission of sputtering material is manifested in the formation of a progressively deepening erosion groove. The formation of this erosion groove alters the performance of the sputtering target, generally with a delaying emission rate from the sputtering target region, a phenomenon referred to as rate "roll-off". This rate roll-off is due in part to the fact that the erosion groove is receding geometrically from the substrate surface, but more significantly, is due to the change in contour of the target surface and the deeply steepening sides of the erosion groove. The steepened sides of the erosion groove tend to shift the direction of emission of the flux of sputtering material, causing it to be less predominantly directed toward a substrate to be coated. In addition, the redirection of sputtered material tends to cause impingement of the material on the oppositely facing wall of the erosion groove and a redeposition of the material onto the target surface. Accordingly, while this erosion proceeds, redeposition of material on the side walls of the erosion groove tends to further narrow the groove. Also, in that sputtering energy is consumed by emission of material, redeposition of the sputtered material onto the target, rather than onto the substrate, progressively lessens the efficiency of the process of effectively coating the substrate surface. Thus, a decline in the deposition rate is experienced. Compensation for the effect of a declining deposition rate is usually achieved by progressively increasing the power applied to the target over the course of the useful target life in order to maintain an acceptable or even constant deposition rate onto the substrates.

The deepening of the steep erosion groove throughout the life of the target and the corresponding necessitated increase in sputtering power have certain disadvantages which shorten the life of the target and inhibit the use of the material of the target efficiently. The deepening of the erosion groove tends to progress toward a rapid punch through of the target in a small area or band on the target surface. When this occurs, the remainder of the material in the target can no longer be used, as the target's life has ended. In addition, the continual increase of the power of the target in order to provide an effective deposition rate, in many cases, will exceed the maximum power which the target can handle and, accordingly, the target life may be prematurely ended when the target can no longer be energized to operate at an efficient sputtering rate. Limiting the increased power to a safe power tends to unacceptably slow down the sputtering process which may have altered effects on the quality of the substrate coating being applied and in addition render the use of the equipment inefficient.

The location of the erosion groove is determined by the placement, in a magnetron sputtering apparatus, of magnet structure which includes pole pieces positioned either behind the side or around portions of the sputtering target. The magnets so formed usually generate magnetic fields which arch over the sputtering regions of the target and which confine the ion producing plasmas therein. The magnetic field lines which over the target generally decline in strength with the distance from the magnet. In order for such fields to effectively confine a plasma, it is necessary that some field line of a particular minimum critical strength arch over the target surface. The necessary strength for the critical field line is dependent on several design parameters, but may, for example, be in the area of approximately 160 to 180 gauss. When a target is new and its sputtering surface is farthest from the magnet, it is found that a certain amount of magnetism is required to produce a critical field line of a proper size and shape over the desired location on the target surface to effectively confine a plasma. Where the magnets are electromagnets and the strengths of the magnetic fields relate to the level of current through the magnet windings, the critical field strength with such a new target can be precisely established.

As the target erodes, however, the erosion groove is formed and the surface of the target recedes toward the underlying magnet. If the strength and shape of the magnetic field are constant as the target erodes, the changing contour of the target surface causes the surface to erode fastest where the magnetic field is strongest and the lines of the strongest field bridge the target surface. Therefore, where the magnetic field at the center of an erosion zone of a new target may have been in the area of 180-190 gauss, as the erosion groove is formed, the field strength at the target surface within the erosion groove may increase to, for example, 240 gauss. At this field strength increases at the target surface, the plasma which forms tends to be more tightly confined and drawn more closely to the target surface. This is found to occur at the center of the erosion groove. This tightening and compacting of the plasma in the presence of the increased field strength is believed to accelerate the formation of a sharply defined, deep, narrow erosion groove in the target surface. While the formation of the deep steeply walled narrow erosion groove in the target surface may be partially overcome with the prior art proposal to move the magnetic field and thus the position of the plasma, in many cases, this will shift the point of origin of the sputtering material so as to unacceptably alter the uniformity of the coating on the substrate surface.

While many schemes for controlling the electrical parameters of a target have been devised, these control schemes have focused on satisfying parameters such as substrate coating uniformity. The prior art has not, however, effectively produced a method for controlling the operating parameters of the sputtering apparatus over the course of the life of the sputtering target in such a way as to avoid undesirable formation of the steep erosion groove without sacrificing or limiting the ability to otherwise control the sputter coating process. It is desirable that the formation of the erosion groove be controlled in such a way that the contour or profile of the target surface most closely conforms to that of the original target throughout the target life, and particularly to be able to do so without moving the sputtering region on the target surface. In this way, the efforts to control the uniformity of the deposition on substrates is rendered easier to achieve while the use of the target material is made more efficient.

SUMMARY OF THE INVENTION

It is a primary objective of the present invention to enhance the performance of a sputtering target having at least one sputtering region thereon in such a manner as to increase the number of substrates which may be coated with a sputtering target over the course of the life of the target. It is a more particular objective of the present invention to enhance the performance of a sputtering target by maintaining a broad erosion profile at the sputtering region of the target.

It is an additional objective of the present invention to enhance the performance of the sputtering target which presents a plurality of sputtering regions, and more particularly, to enhance the performance of a sputtering target formed of a single piece of sputtering material having thereon a plurality of sputtering regions.

In accordance with the present invention, there is provided a sputtering target having one or more magnets which define sputtering regions on the target surface. Each magnet generates a plasma confining magnetic field over a corresponding region of the sputtering target, each field having a critical field line which determines the shape of the plasma which forms over the region. Over the course of the useful life of the target, according to the principles of the present invention, the critical field lines are progressively flattened as the target erodes. This flattening is caused to occur progressively over the active or useful life of the target in accordance with the erosion of the target. The progressive flattening of the critical field lines over the sputtering regions of the target, may occur either continuously or intermittently, but at frequent enough intervals so that the plasma does not tend to concentrate at the center of the erosion groove. As such, a broad erosion profile at the sputtering region of the target is thereby maintained.

With targets having more than one erosion zone formed by plural magnets, each generating separate fields with separate critical field defining lines to define the position and shapes of the plasmas over the respective regions, the principles of the invention may be employed at one or more of the target regions to extend target life and target performance. In the preferred application of the present invention, the target performance is enhanced with respect to a multiple plasma, one piece target in which the two plasmas are alternately switched on and off by the switching of the currents to the electromagnets which produce the respective magnetic fields that contain them. In multiple plasma applications, the present invention is particularly useful when employed with respect to the one region of the target which is responsible for the major portion of the sputtering, but may also be employed at the other regions of the target with advantage. In an application where power to any given target region is switched on and off, the "life" of the target, or any region of a target, as that term is used herein, includes only that portion of the cycle during which the relevant sputtering region is activated by the energization of the magnet supporting the plasma to thereby cause the sputtering to occur from the target or target region.

In accordance with the preferred embodiment of the present invention, the magnets include a structure having a design which results in the shape of the critical field lines having a tendency to flatten over the sputtering region of the target as the strength of the magnetic field decreases. It has been found that such a magnet structure includes, but is not necessarily limited to, those magnets, particularly electromagnets, which have pole structures which are spaced behind and around the sides of a particular sputtering region of the target. Such magnet structure preferably surrounds the target material in such a way that, as the target erodes, the erosion groove recedes down into the target and between the ends of the pole pieces. Many various magnet structures, however, may be devised having such a tendency.

Further in accordance with the present invention, the field strength of the magnet is reduced, or otherwise changed, over the useful life of the target, so as to cause the critical field line over the target region to progressively flatten as the target erodes. This reduction of field strength is preferably achieved by providing an electromagnet and progressively reducing the current through the coil of the electromagnet in such a way as to cause the field strength to decline and to cause the critical field line to thereby flatten.

Further in accordance with a preferred embodiment of the present invention, the target is energized with a regulated power supply, which may be regulated at a constant power or in accordance with some other predetermined relationship or criteria. Such a power supply would preferably be caused to operate at a regulated power which increases over the useful life of the target in such a way as to maintain the sputtering deposition rate from the target region at an approximately constant level. Such power supplies then tend to develop a voltage-to-current ratio that is responsive to changes in the parameters of the target, including target erosion, so as to supply power at the regulated level. It has been found, for example, that such a power supply seeks a voltage level necessary to deliver the regulated power to the target, which, as the target erodes, is found to decline. It has also been found that reducing the magnetic field strength over the target region tends to increase the voltage which the power supply must deliver in order to produce the regulated power.

By controlling the magnetic field strength of the target magnet in such a way as to reduce the field strength of magnets, the shape of the plasma confining critical field line changes, changing the erosion of the target. As that field strength is decreased, broadening the erosion zone occurs. By reducing this field strength in such a way as to maintain the voltage of the target power supply at or above some predetermined level, and so controlling the magnetic field in this way over substantially the entire life of the target, the erosion groove becomes broader and the use of material from the target surface is enhanced. Particularly by reducing the field strength to maintain the power supply voltage at a constant level throughout the life of the target, the results of the invention are achieved.

According to the preferred embodiment of the invention, the current to the coil of an electromagnet, having pole pieces that surround the target material, is reduced to reduce the field strength and thereby flatten the magnetic field over the target, particularly the critical plasma containing field line over the target region being sputtered, when the power supply voltage drops below a predetermined level to maintain the power supply voltage at or above a desired level. By doing so, effective enhancement of the performance of a sputtering target is attained.

As a result of the present invention, it has been found that the width of the erosion groove formed on a sputtering target region is broadened so as to render the target capable of delivering more sputtering material over the life of the target, that is, before the erosion of the target proceeds to punch through to the back of the target, or the target power exceeds the limit of the target. This broadening of the erosion groove can be obtained without movement of the effective location of the region on the target surface from which sputtering is occurring. Furthermore, it has been found that the amount of power needed to sustain a constant deposition rate on the substrate from a target, in accordance with the principles of the present invention is reduced over the life of the target so that the power increase proceeds more slowly, not only delaying the point in time at which a target can no longer be operated because the power is too high, but in reducing heat, arching, and other undesirable side effects of high power. As a result, the number of substrates which can be coated with a given deposition thickness has been drastically increased by as much as 30% with targets of proper design.

These and other objectives and advantages of the present invention will be more readily apparent from the following detailed description of the drawings in which:

DETAILED DESCRIPTION OF DRAWINGS

Magnetron sputtering devices of the type to which the present invention relates are described in the following commonly assigned U.S. patents and copending patent applications which are hereby expressly incorporated in their entirety into this application by reference:

U.S. Pat. No. 4,853,033 for "Cathode Target Design for a Sputter Coating Apparatus";

U.S. Pat. No. 4,871,433 for "Apparatus for Improving the Uniformity of Ion Bombardment In a Magnetron Sputtering System";

U.S. Pat. Nos. 4,909,675 and 4,915,564 entitled "Method and Apparatus for Handling and Processing Wafer-Like Materials"; and, Pending U.S. patent application Ser. No. 07/339,308, filed Apr. 17, 1989 entitled "Method and Apparatus for Sputter Coating Stepped Wafers."

Figure 1:
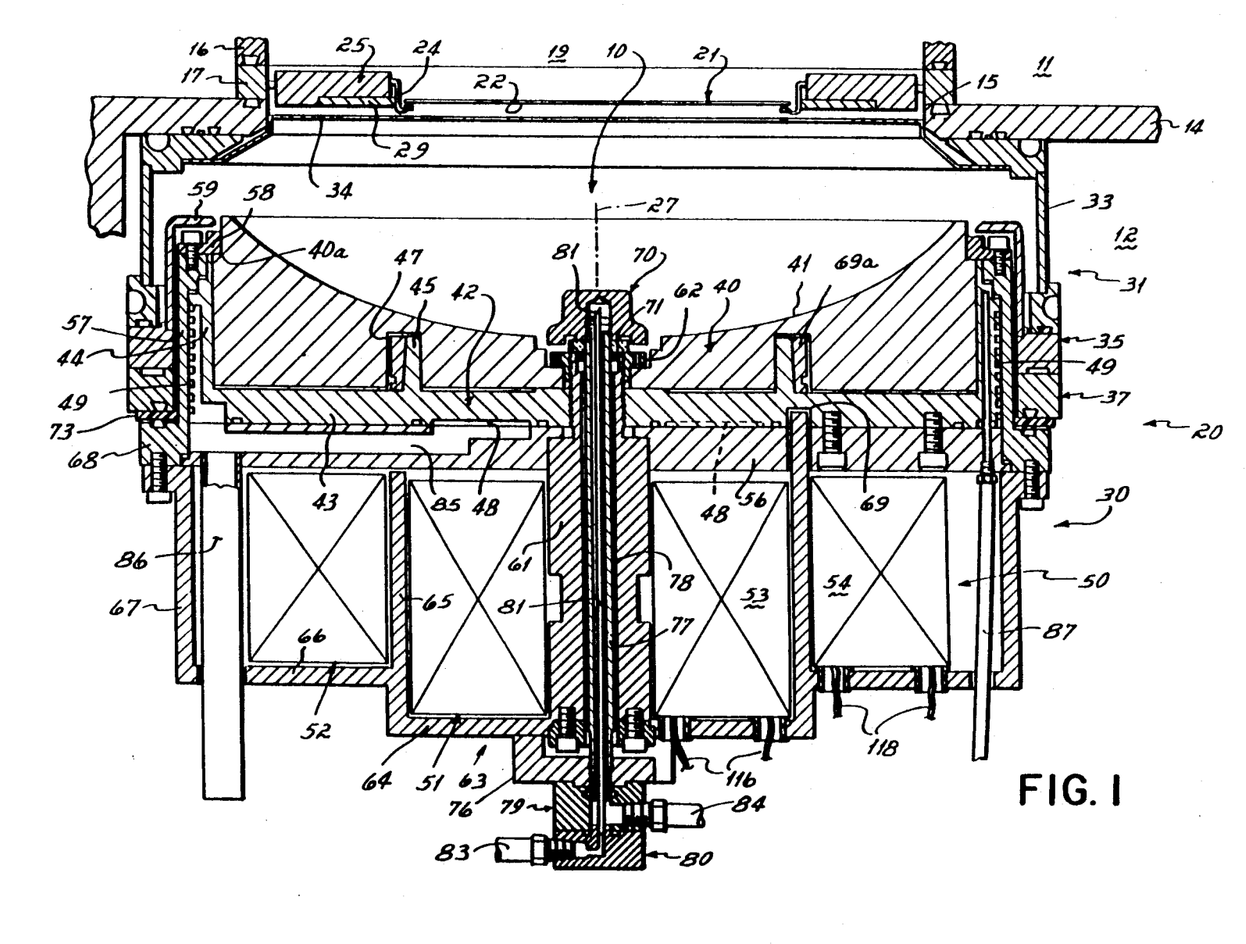
FIG. 1 is a cross-sectional view of a processing chamber of the sputter coating apparatus embodying principles of the present invention.

FIG. 1 illustrates, in cross-section, a sputter coating processing chamber 10 of a sputter coating apparatus according to principles of the present invention. The chamber 10 is a portion of the sputter processing apparatus disclosed in U.S. Pat. No. 4,909,675. The processing chamber 10 is a vacuum processing chamber formed of an isolated section of a main chamber 11. The main chamber 11 is isolated from the atmosphere of the machine environment 12 by a plenum wall 14. The processing chamber 10 is capable of communicating with the main chamber 11 throughout opening 15 in the plenum wall 14. The opening 15 is generally circular. The processing chamber 10 is capable of being selectively isolated from the main chamber 11 by the selective movement of a processing chamber back plane section 16 against a portion of a disk shaped rotary wafer transport member 17 clamping the transport member 17 between the backplane section 16 and the plenum wall 14 in a sealing relationship, thereby enclosing a back plane space 19 within the processing chamber 10 and isolating the processing chamber 10 from the main chamber 11.

Opposite the backplane section 16, on the front plane side of the transport member 17, the processing chamber 10 is isolated from the machine environment 12 with a cathode assembly module 20 mounted in a vacuum sealing relationship against the plenum wall 14 surrounding the opening 15. The module 20, or processing chamber frontplane section, cooperates with the backplane section 16 and the transport member 17 to form the sealed isolated processing chamber which is isolated from both the main chamber 11 and the machine environment 12. Within the processing chamber 10 is a workpiece 21 in the form of a flat silicon wafer or disk which has the surface 22 upon which a coating is to be deposited in a sputter coating process to be performed within the processing chamber 10. The wafer 21 is held by a set of clips or other retaining devices 24 in a wafer holder 25 resiliently carried by the transport member 17. The transport member 17 is rotatable within the main chamber to bring the holder 25, and the workpiece or wafer 21 into alignment with the hole 15 so that the processing chamber 10 can be formed around the wafer 21 on the holder 25 by transverse movement of the backplane section 16 to move the member 17 against the plenum wall 14. (The transport member portion 17 is a transversely movable ring carried by a rotatable index plate which is not shown.) In this preferred embodiment, the wafer 21 is concentric with and supported in a plane perpendicular to a central axis 27 of the main chamber 10, which is also concentric with the hole 15 in the plenum wall 14. Surrounding the wafer 21 on the holder 25 is a disk 29 which at least partially protects the holder 25 from an excessive accumulation of coating intended for but which missed, the surface 22 of the wafer 21. Details of the sputtering apparatus of which the processing chamber 10 is a part including particularly details of the wafer transport 17, wafer holder 25, and back plane section 16, are described and illustrated in the U.S. Pat. Nos. 4,909,675 and 4,915,564 incorporated by reference above.

The cathode assembly module 20 includes two assemblies, a removable cathode assembly 30 and a fixed assembly portion 31. The fixed assembly portion 31 is an annular enclosure rigidly mounted in sealed relationship against the plenum wall 14 surrounding the opening 15. It includes a cylindrical metal side wall 33 of the chamber 10 which is electrically grounded to the frame 14 of the plenum, a wafer holder shield 34 which surrounds the opening 15 and a chamber door frame assembly 35.

The cathode assembly 30 is mounted to a hinged door assembly 37 which removably but sealably supports the cathode assembly 30 to the fixed assembly 31. The cathode assembly 30 carries the sputtering target 40, which is an annular concave target having a continuous smooth concave sputtering surface 41. The assembly 30 supports the target 40 with its axis in alignment with the axis 27 of the chamber 10 and with its sputtering surface 41 facing the surface to be coated 22 of the wafer 21.

The target 40 is supported in a target holder or nest 42 having a generally circular back plate 43 concentric with the axis 27. The target holder 42 has an outer cylindrical wall 44 and an upstanding cylindrical midwall 45. The outer wall 44 surrounds the outer rim of the target 40. The target 40 has an outer cooling surface which, when the target 40 is mounted in holder 42 and expanded to operating temperature, conforms to and lies in close cooling contact with the inner surface of the holder 42. An annular groove 47 on the back of the target 40 lies in partial contact with the midwall 45 of the holder 42. The target holder or nest 42 has a plurality of annular grooves 48 in its back surface and annular grooves 49 on the outside of its outer wall 44 for the circulation of cooling liquid, which is generally water, to remove heat generated in the target 40 during sputtering by cooling the heat conductive target holder 42. The shapes of the surfaces of the target 40 are preferably such that all the target 40 is capable of being formed by turning block of sputtering material on a lathe. The target holder 40 is made of a heat conductive and electrically conductive material. preferably hard tempered OFHC copper or Alloy 110. The target 40, when operationally heated, expands and preferably plastically deforms into a shape which conforms tightly to the interior cavity of the holder 42 and thereby cooperates with the holder 42 to conduct heat thereto. The cooperation of the holder 42 and the target 40 are preferably as described in U.S. Pat. No. 4,871,433 incorporated by reference above.

The target assembly 30 is provided with a magnet assembly 50 which preferably includes a pair of concentric annular magnets 51 and 52, preferably electromagnets having annular inner and outer windings 53 and 54, respectively, lying concentrically in a plane behind the target holder 42 and centered about and perpendicular to the axis 27. A rigid ferrous material, such as 410 annealed stainless steel, forms the structural support of target assembly 30 and constitutes the magnetic pole pieces of the magnets 51 and 52. This ferrous material includes a circular center plate 56, which forms the planar rear support of the assembly 30 and sustains the transverse magnetic field between pole pieces of the magnets 51 and 52. A cylindrical outer pole piece 57 is welded to the plate 56 at the outer edge thereof to stand upwardly therefrom and to surround the outer wall of the holder 42. A target outer retainer ring 58, is bolted to the upper edge of the outer pole piece 57, so as to rest on an outer annular lip 40a of the target 40 to retain the target 40 in the nest 42. The upper exposed surface of the outer pole piece 57 and ring 58 is shielded by a metal dark space shield 59, which prevents sputtering of the pole piece 57 or retainer ring 58. The dark space shield 59 is rigidly secured to the chamber wall 33 and thereby electrically grounded.

An inner cylindrical pole piece 61, having as its axis the axis 27, projects through the inner rim of the target 40. This pole piece 61 is threaded through the center of the holder 42 below the target 40, and has threaded thereon, above the target 40, a center retainer nut 62 which retains the target 40 at its center hole. The center pole piece 61 has bolted to the bottom end thereof a pole cap assembly 63. The pole cap assembly 63 includes a circular inner plate 64, a cylindrical lower middle pole piece 65 welded at its base to the outer edge of the plate 64, an annular outer plate 66 welded at its inner edge to the outside of the lower middle pole piece 65, and a lower cylindrical outer pole piece 67 welded at its base to the outer edge of the annular plate 66. The lower outer pole piece 67 has bolted to its upper edge, base 68 of outer pole piece 57. The components 64, 65, 66 and 67 of the pole cap 63 have a common axis lying on the axis 27 of the chamber 10.

The middle cylindrical pole piece 65 underlies the annular groove 47 in the back of the target 40, and projects either in a continuous annular ring or at spaced intervals through the plate 56 into a recess 69 in the back surface of the holder 42. A ring 69 of rigid ferromagnetic material and having approximately the same diameter as that of the middle pole piece lies, and is embedded within, the annular groove 47 in the back surface of the target 40. The upper end of the middle pole piece 65 lies in the annular groove through the surface of the backplate 56 close to the ring 69a. The ferromagnetic ring 69 surrounds the midwall 45 of the holder 42 in the groove 47 in the back of the target 40.

The middle pole piece 65 together with the ring 69a form a pole piece which the inner and outer magnets 51 and 52 have in common. The ring 69a is magnetically coupled to the middle pole piece 65 so as to extend the effective pole piece at the annular groove 47 of the target 40 to very near, but beneath, the surface 41 of the target 40. In that the ferromagnetic ring 69a is of a rigid ferromagnetic material, it is substantially stronger structurally than the soft copper of the holder 40 is made of a material which expands less when heated. As such, it serves to structurally reinforce the midwall 45 of the target holder 42 against radial expansion caused by the heating of the target 40, thereby also restraining the target 40 against radial thermal expansion.

Concentrically mounted at the top of the center pole piece 61 is a central electrode 70, electrically insulated from the pole piece 61 by a ceramic washer 71. The center pole piece 61, the target 40, the holder 42 and the entire center plate 56 and pole cap assembly 63 are energized to the same cathode potential. Accordingly, the assembly 30 is insulated from the grounded fixed assembly 31 by a Teflon insulated annular spacer 73.

A center pole cap 76 is fixed to the bottom of the pole cap assembly 63, concentric with the axis 27. The cap assembly 63 supports an outer cooling fluid tube 77 which extends vertically through a bore 78 in the central pole piece 61 to the electrode 70 with which it makes electrical contact. The tube 77 is electrically conductive and insulated from the cap 76 to provide for the energizing of the electrode 70 at a potential which is different from the target 40 or the grounded chamber wall 33. Mounted to the bottom of the cap 76 is an outlet tube assembly 79 for transmitting cooling fluid from the tube 77. An inlet assembly 80, connected to the base of the outlet assembly 79 supports an inlet tube 81 which extends through the center of the tube 77 to the electrode 70 to supply cooling fluid thereto. A water inlet 83 and outlet 84 are provided in the inlet assembly 80 and outlet assembly 79 respectively. Similarly, cooling passages 85 are provided in the plate 56 for communicating cooling water from passages 48 and 49 to a cooling water outlet 86 in the plate 56. A cooling water inlet 87 communicates water through a grinder inlet duct to the passages 48 and 49 in the holder 42.

Figure 2:
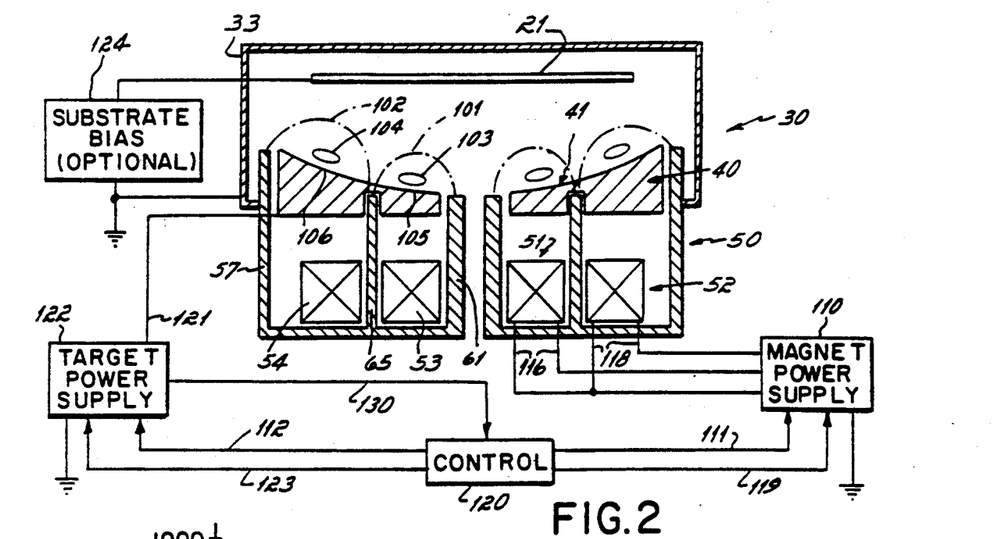
FIG. 2 is a diagram illustrating an electrical circuit arrangement according to principles of the present invention.

Referring to FIG. 2, the target 40 is shown supported in the target or cathode assembly 30 which includes the magnet core 50 which in turn includes the cylindrical outer pole 57, the center post or pole piece 61 and the cylindrical intermediate pole piece 65. The outer pole piece 57 surrounds the outer edge of the target 10 while the center pole piece 61 projects through the central hole of the target 40. The intermediate pole piece 65 extends into the annular groove 47 which is formed in the back surface of the target 40.

For purposes of the present invention, the magnets, of which the pole pieces 57, 61 and 65 of the magnet core 50 form a part, may be capable of producing a field line which can be progressively flattened over the life of the target, either mechanically or electrically, and either by making the magnet assembly 50 function in a variable manner or by the introduction of auxiliary magnets which can cooperate with the structure 50 to vary the field. Mechanical flattening of the field is less desirable in that it would normally require the movement of magnet elements, a technique which is less flexible and complex. Accordingly, the use of electromagnets as described herein is preferred.

In the preferred embodiment illustrated in FIG. 2, the magnets 51, 52 are electromagnets having inner and outer magnet windings 53, 54. When energized with current, the magnet windings 53 and 54 generate magnetic fields, represented generally by the arched lines 101 and 102, respectively, in FIG. 2, over the sputtering surface 41 of the target 40, which confines or traps the respective plasmas, illustrated generally as the oval shapes 103 and 104, respectively, over respective inner and outer sputtering regions 105 and 106 on the target surface 41 in FIG. 2. In addition, the magnet core structure 50 which includes the positions and shapes of the pole pieces 57, 61, and 65 particularly, in extending around respective regions 105 and 106, respectively, of the target surface 41, produces change in shape as the current in the coils or windings 53, 54, and thus the strengths of the fields 101, 102 vary, as described more fully below in relation to FIG. 4.

In the preferred and illustrated embodiment of the invention, the magnets 53, 54 are alternately switched on and off so as to alternately maintain magnetic fields 101 and 102 at alternating times over the respective regions 105, 106 of the surface 41 of the target 40 thereby alternately activating the regions 105, 106 for sputtering. The fields 101 and 102 are maintained alternately to alternately support respective plasmas 103 and 104 over the target regions 105, 106. In this embodiment, the "flattening" of the field refers to the fields which exist only when the respective magnets 51, 52 are energized. Similarly, the "life" of the target or more specifically of a region of the target refers herein to the times during which a given region is activated and material is being sputtered therefrom.

The magnet currents are switched by a switching power supply 110, which supplies current alternately at desired levels through lines 116 and 118 respectively, to coils 53 and 54. The magnet power supply 110 switches, in response to a timing signal on a control line 111 from a programmable or settable control circuit 120. The magnets alternately energize to current levels responsive to a control signal on line 119 from the controller 120. The switching of the magnets causes a corresponding alternate activation of the plasmas 103 and 104.

A power supply 122 supplies power to the target 40 through a line 121 from the target power supply 122. This power is switched between two regulated power levels in response to a signal applied through line 123 from the control circuit 120. The switching of the magnet power supply 110 and that of the target power supply 122 are maintained in synchronism under the control of control 120 by a power timing signal supplied to the target power supply 122 on line 112 from the controller 120.

The substrate 21 to which the sputter coating is to be applied may, for some applications, also be subjected to a bias voltage through a substrate bias power supply represented generally by the block 124 in FIG. 2. The voltage of the substrate 21 may be, in the alternative, maintained at the same voltage as a system anode represented by the chamber wall 33 which is generally at ground potential. While illustrated in connection with a switched dual plasma apparatus using a one piece concave annular target, the features of the present invention are applicable to single plasma, non-planar targets, and to systems which may be magnetron enhanced either with permanent or electromagnets.

Furthermore, the target power supply 122, which supplies the sputtering energy to the target 40, may produce a constant power output. Over the life of the target, however, the total power output on line 121 of the target power supply 122 may be periodically adjusted, preferably by continuously, periodically, or otherwise progressively increasing the regulated level of power delivered to the target 40 to maintain a constant deposition rate upon the wafer 21. Such deposition rate may be, for example, one micron for every 45 seconds of target energization. This maintenance of constant deposition rate in the face of the phenomena known as rate roll-off, which occurs as the target is eroded over the course of its useful life, usually is compensated by increasing the power output of the target power supply 122 over that life. When, as in the preferred embodiment, the target regions are alternately energized, the power delivered to the target 40 is switched between two regulated power levels in synchronism with the magnet current switchings, one for each region 105, 106 of the target, so that the sputtering from the different regions can proceed at a power level appropriate for sputtering from that region. The increasing of the sputtering power, in a system so controlled, will be carried out by independently increasing the regulated power levels at different rates corresponding to the different rate roll-off of the different sputtering regions 105, 106.

The controller 120 is also provided with an input line 130 which is connected to the target power supply 122 to provide a signal to the controller 120 proportional to the voltage on the power supply output line 121 to the target. The controller 120 contains a differential amplifier or other functionally equivalent circuit that compares the voltage reference signal on line 130 with some predetermined reference voltage. The controller 120 develops, from the difference between the target voltage signal 130 and the reference voltage, an error signal that controls the current level signal on line 119 to the magnet power supply 110. This control function operates to reduce progressively the energizing current on the respective magnet winding 53 or 54 as the voltage of the target power supply, when the respective winding is activated, drops below the reference level. Similarly, the current of the activated magnet will increase whenever the voltage of the target power supply rises above the reference voltage. A different reference voltage is provided for each target region. Each region 105, 106 of the target 40 is separately controlled by changing the coil current separately to the magnet windings 53, 54.

In the alternative, line 130 may be connected, instead of to the power supply 122, to the output of a target erosion sensor, and the signal on line 130 compared at the controller 120 with some reference criteria. In response to the comparison, the controller 130 will generate an error signal which will be logically processed to control the current of the magnet power supply 110 to reduce the current on a respective one of the magnet windings 53 or 54 in accordance with the sensed target erosion at the respective target regions 105, 106.

Figure 3:
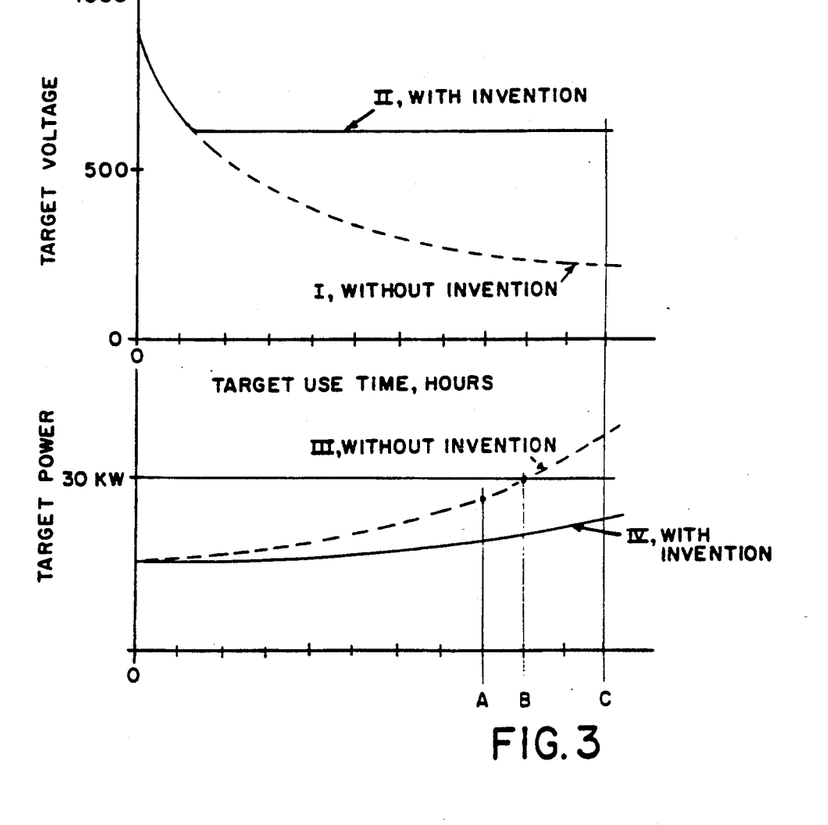
FIG. 3 is a graph illustrating the variation of various electrical values of the circuit of FIG. 2 as a function of time over the operative life of the target.

Referring to FIG. 3, curve I represents a typical course of variation of activation level of the voltage of the power supply on line 121 to the target 40, for any given region of the target, as the sputtering surface 41 of the target erodes over the life of the target. This voltage generally tends to decline. At the same time, to maintain a constant deposition rate, the power applied to the target 40 from the power supply 122 would, without the invention, typically increase along the curve III of FIG. 3. Thus, without the invention, the life of the target would be ended in one of two ways. First, the end of the life of the target could occur when the target burns through to its back surface, that is, when the erosion groove penetrates the target. This is represented by point A on curve III in FIG. 3. Also, even when the target does not burn through, its useful life could nonetheless be terminated when the required power level exceeds a maximum level that can be tolerated by the target, as illustrated by point B on curve III in FIG. 3.

With the present invention, a control signal on line 130 is processed by controller 122 to vary the control signal on line 119 to the magnet power supply 110 to adjust the levels of the currents on the magnet windings 53, 54, in order to maintain a constant target energization voltage on line 121 to target 40 to produce a constant energization voltage over the useful life of the target as shown by curve II of FIG. 3. It has been experienced that, with this control of the present invention, the power from the target power supply 122 to the target 40 need be increased less rapidly than attempting without the invention to maintain a constant deposition rate. Accordingly, the target power supply power on line 121, with the present invention, will conform more to curve IV in the graph of FIG. 3. Thus, the end of the life of the target has been found to occur at the point C on curve IV, after approximately 25 to 30% more substrates have been processed than with the prior art control method that terminated at point B in in graph of FIG. 3. This improved performance is believed to be a result of the broadened erosion groove that results from the present invention as described in relation to FIGS. 4–4C below.

Figure 4:
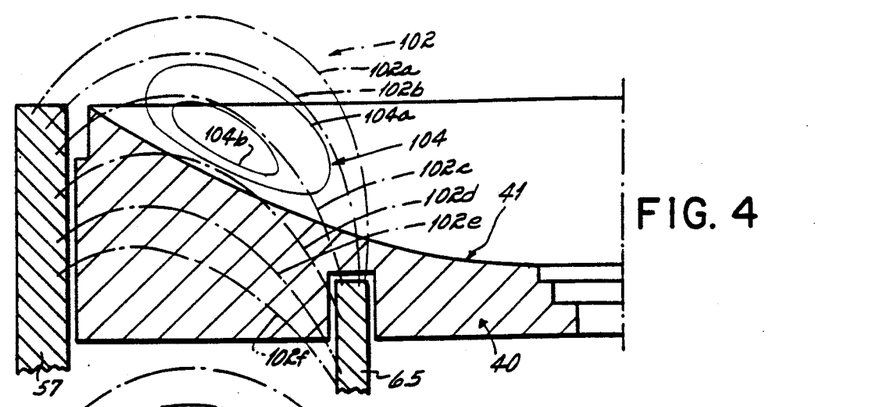
FIGS. 4, 4A, 4B and 4C are fragmentary cross-sectional diagrams of targets comparing the field line, plasma and erosion groove shapes with and without the present invention.

FIG. 4 illustrates the configuration of the field 102 and the shape of the plasma 104 for the outer target region 106 of a target 40 at the beginning of a sputtering process when the target 40 is new. Given the particular current through the winding 54 of the magnet 52, a field will develop over the region 106 having a strength and shape represented by the individual field lines 102a–102f. These lines represent fields of respectively increasing strength varying from, for example, 160 gauss to 260 gauss. Given the particular conditions of the sputtering chamber, one of these lines, for example, a 180 gauss field strength line 102b, represents a critical field line of a minimum strength required to sustain and support a glowing plasma discharge 104 bounded by line 104a. With such a magnetic field configuration, plasma will tend to be more dense near the surface 41 of the target 40. This is, in part, because the field at line 102c is of a greater field strength, for example, 200 gauss. The field lines 102b and 102c emerge above the surface 41 to form a closed tunnel or magnetic trap over the region 106 of the target surface 40. The stronger field line 102c tends to contain the more dense area of the plasma 104 as represented by the line 104b of FIG. 4. The sputtering of the target surface 41 at the region 106 will proceed more rapidly in proximity to the portion of the plasma 104 that is the densest.

Figure 4A:
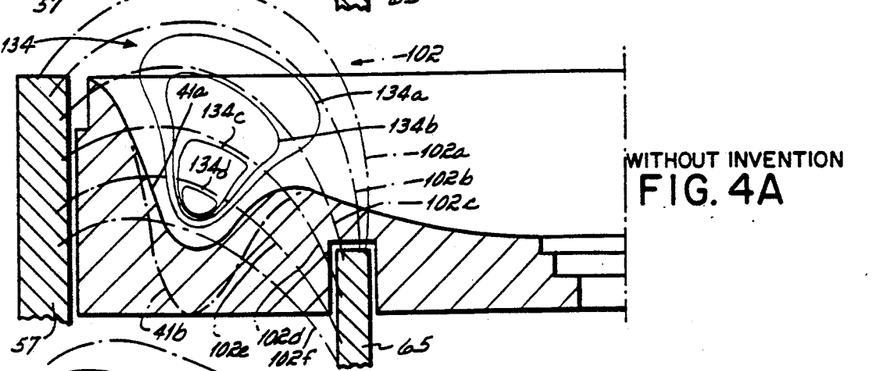

Without the present invention, as seen in FIG. 4A, as the target 40 proceeds to erode, an erosion groove 41a in the surface 41 will develop. Without the present invention, this erosion groove will deepen over the life of the target until ultimately the groove punches through the target as illustrated by the erosion groove surface contour 41b. As this occurs, the plasma 134 is drawn deeper into the erosion, as at erosion groove 41a, where it tends to be more dense as illustrated by the portions 134c and 134d, within the weaker portions of the plasma 134a and 134b. This is believed to be due to the influence of the stronger field represented by lines 102d and 102e. As a consequence of a stronger and denser plasma 134, the rate of ion flux bombardment at the target surface increases, particularly in the deep portion of the erosion groove 41a. This causes a current-voltage ratio in the power delivered to the target 40 to increase. In addition, particles sputtered from the surface 41a tend to impact with increasing frequency upon other portions of the surface 41a, from one side of the deepening groove 41a to the opposite side of the erosion groove 41a, thus reducing the sputtering efficiency and the deposition rate onto the substrate. This decline in the deposition rate, or rate roll-off, is normally offset with the increasing of the power applied to the target 40 until that deposition rate is maintained at a constant level on the substrate, but also increasing the redeposition on the sides of the erosion groove 41a. This redeposition of material on the target surface tends to further narrow the erosion groove 40a. When the target has punched through, as shown by the groove 41b in FIG. 4A, the remainder of the material in the target 40 is unusable. In addition, the increase of the power to offset the sputtering rate roll-off due to the deepening of the erosion groove may have, in certain instances, exceeded the capability of the target thus ending the useful life of the target even before punchthrough.

Figure 4B:
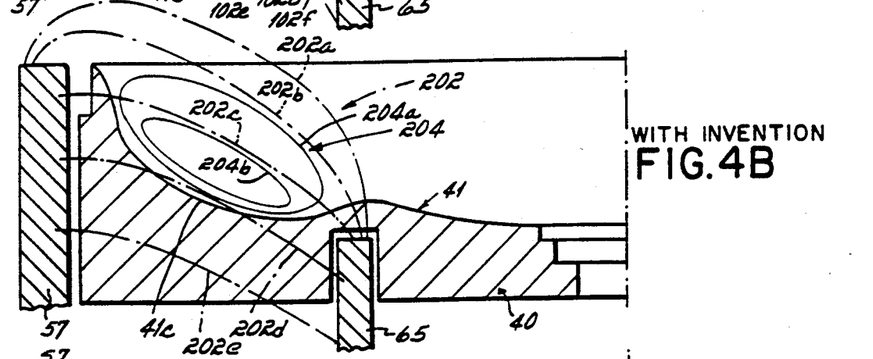

Referring to FIG. 4B, the progressive erosion of the target 40 in the system embodying the principles of the present invention is illustrated. The structure of the magnet 52 is such that, as the field between the pole pieces 57 and 65 declines in strength, the field lines between the pole pieces 57 and 65 tend to flatten. The field lines 202a–e represent fields of strengths of, for example, 160 through 240 gauss, in increments of 20 gauss, assume less curved shapes at positions closer to and behind the original surface 41 of the target 40. Accordingly, the critical plasma defining line 202b of, for example, 180 gauss, defines a plasma 204 of a shape illustrated by the line 204a. The 200 gauss field line, 202c, confines the denser portion of the plasma 204b above the eroded target surface 41c. The stronger field lines 202d and 202e will be below and not above the erosion surface 41c. These field lines 202a–e will have a flattened shape in relation to field lines 102a–e of corresponding strengths as shown in FIGS. 4 and 4A. As such, the shape of the plasma 204, as shown with the invention in FIG. 4B, is broader over the surface 41c, causing the surface 41c to erode more broadly, thus assuming a profile of an erosion groove 41c which is broader and shallower than the groove 41a of FIG. 4A.

Figure 4C:
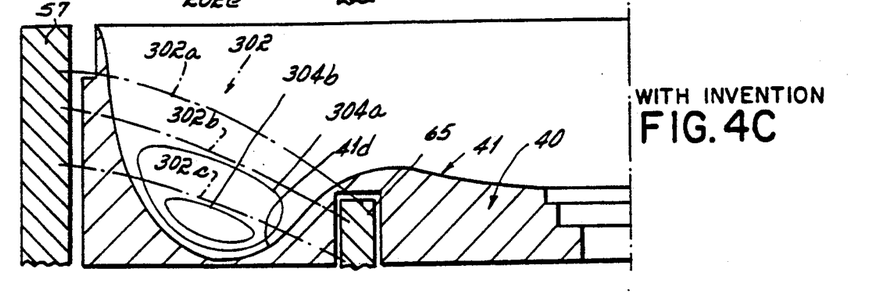

Similarly, as seen in FIG. 4C, as the target approaches punch through condition where the target surface 41 assumes a profile 41d, evidencing an erosion groove nearing the back surface of the target 40, a wide erosion pattern will have developed and substantially more of the target than in FIG. 4A will have been rendered usable. To approach this condition, the strength of the field 302 as shown in FIG. 4C continues to flatten such that the plasma confining field lines 302a-c are recessed into the erosion groove 41d, confining the plasma 304, including both the less and more dense portions 304a, 304b thereof, in a broad flat band near the eroded surface 41d.

While variation of the magnet strength has been described in the illustrated embodiment in conjunction with magnet pole pieces 57 and 65 that cause the magnetic field to flatten as the magnet current is decreased, other means such as the employment of auxiliary magnets, electrically variable or mechanically movable, may be employed for this purpose.

While the invention has been described in relation to its preferred embodiments, it will be appreciated by those skilled in the art that variations therefrom may be made without departing from its principles.

Accordingly, the following is claimed:

1. A method of enhancing the performance of a generally concave magnetron sputtering target having at least one annular sputtering region thereon to increase the number of substrates coated from the target over the course of the life of the target as the target erodes, said method comprising the steps of:
    providing an electromagnet having exterior pole structure generally surrounding the sputtering region of the target, and having interior pole structure of an opposite polarity opposite that of the exterior pole structure and spaced inward thereof, and positioning the external and internal pole structures such that, as the target erodes, the sputtering surface thereof progressively recedes within and between the pole structures of the electromagnet;
    supplying current to the electromagnet to generate therewith a plasma confining magnetic field having magnetic lines of force extending radially over said region of the target between the interior and exterior pole structures of the electromagnet;
    energizing the target by supplying electric power thereto to cause material to be sputtered from the sputtering region thereof and deposited at a predetermined rate onto a substrate that faces the sputtering region of the target;
    sensing voltage supplied to the target and producing a control signal in response thereto;
    progressively increasing the power supplied to the target over substantially the entire useful life of the target as the target erodes; and
    progressively reducing the current supplied to the electro magnet in response to the control signal to maintain the voltage at a generally constant level.

2. The method of claim 1 wherein:
    the power increasing step includes the step of increasing the power supplied to the target so as to maintain the predetermined rate at which material is deposited onto the substrate at an approximately constant level.

3. A method of enhancing the performance of a magnetron sputtering target having at least one sputtering region thereon to increase the number of substrates coated from the target over the course of the life of the target by maintaining a broad erosion profile at the sputtering region as the target erodes, said method comprising the steps of:
    providing an electro magnet to produce a plasma confining magnetic field having magnetic lines of force extending over the sputtering region of the target, the filed having lines of force representing different strengths of the magnetic field, the lines of force including a critical field line which determines the shape of a plasma formed over the sputtering region;
    positioning the electro magnet with respect to the target such that the lines of force have initial positions above the sputtering region and through the target, and such that, as the target erodes, the sputtering region thereof progressively recedes through different ones of the positions;
    energizing the target by supplying electric power thereto to cause material to be sputtered from the sputtering region thereof and deposited at a predetermined rate onto a substrate that faces the sputtering region of the target;
    sensing voltage supplied to the target and producing a control signal in response thereto;
    progressively increasing the power supplied to the target over substantially the entire useful life of the target as the target erodes; and
    over the useful life of the target, progressively reducing the strength of the field and progressively flattening the critical field line over the sputtering region of the target in response to the control signal to maintain the voltage, as the power increases and the target erodes, at a level that is significantly greater than that which would result if electro magnet current and target power were to remain constant and significantly less than that which would result if target impedance were to remain constant as the power to the target is increased.

4. The method of claim 3 wherein:
    the power increasing step includes the step of increasing the power supplied to the target so as to maintain the predetermined rate at which material is deposited onto the substrate at an approximately constant level.

5. The method of claim 3 wherein:
    the electro magnet providing step includes the step of providing an electromagnet having a coil and the step of producing a field of a strength which is related to the current through said coil; and
    said field strength reducing step includes the step of progressively reducing the current through the coil in response to the control signal.

6. The method of claim 5 wherein:
    the current reducing step includes the step of progressively reducing the current supplied to the electro magnet in response to the control signal to maintain the voltage at a generally constant level.

7. The method of claim 3 wherein:
    the field strength reducing step includes the step of progressively reducing the field strength of the electro magnet in response to the control signal to maintain the voltage at a generally constant level.

8. A method of enhancing the performance of a generally concave magnetron sputtering target, which is formed of a single piece of sputtering material having a plurality of sputtering regions thereon, including a first sputtering region and a second sputtering region, to increase the number of substrates coated from the target over the course of the life of the target as the target erodes, said method comprising the steps of:

- providing an electromagnetic for each sputtering region of the target, including a first electromagnet having a first pole structure extending into the target between the first and second sputtering regions and a second pole structure of opposite polarity located opposite the first sputtering region from the first pole structure such that sputtering material beneath the first sputtering region lies directly between the first and second pole structure, the first and second pole structures being positioned with respect to the target such that, when current is supplied to the first electromagnet at a given level, a magnetic field is produced having lines of force representing different strengths of the magnetic field at respective different positions above the first sputtering region and through the sputtering material between the first and second pole structures, the positions being located such that, as the target erodes at the firs sputtering region, the first sputtering region progressively recedes between the first and second pole structure through different ones of the positions at which the lines of force progressively flatten;
- supplying electromagnet current to the first electromagnet sufficient to generate therewith a plasma confining magnetic field over the target, the field having magnetic lines of force extending over the first sputtering region of the target;
- while current is being supplied to the first electromagnet, energizing the target by supplying electric power thereto to cause material to be sputtered from the first sputtering region and deposited onto a substrate that faces the target;
- sensing voltage supplied to the target, when the target is energized and current is being supplied to the first electromagnet, and producing a control signal in response to the voltage sensed; and
- progressively reducing the current supplied to the first electromagnet throughout the useful life of the target in response to the control signal.

9. The method of claim 8 wherein:

the electromagnet providing step includes the step of providing a second electromagnet having a third pole structure of an opposite polarity of the first pole structure located opposite the second sputtering region from the first pole structure such that sputtering material beneath the second sputtering region lies directly between the first and third pole structure, the first and third pole structures being positioned with respect to the target such that, when current is supplied to the second electromagnet at a given level, a magnetic field is produced having lines of force representing different strengths of the magnetic field at respective different positions above the second sputtering region and through the sputtering material between the first and third pole structures, the positions being located such that, as the target erodes at the second sputtering region, the second sputtering region progressively recedes between the first and third pole structures through different ones of the positions at which the lines of force progressively flatten;

- terminating the current to the first electromagnet and supplying only to the second electromagnet current sufficient to generate therewith a plasma confining magnetic field over the target, the field having magnetic lines of force extending over the second sputtering region of the target;
- while current is being supplied to the second electromagnet, energizing the target by supplying electric power thereto to cause material to be sputtered from the second sputtering region and deposited onto the substrate;
- sensing voltage supplied to the target, when the target is energized and current is being supplied to the second electromagnet, and producing a control signal in response to the voltage sensed;
- progressively increasing the power supplied to the target, when material is being sputtered from the second sputtering region, throughout the useful life of the of the target as the second sputtering region of the target erodes; and
- progressively reducing the current supplied to the second electromagnet throughout the useful live of the target in response to the control signal.

10. The method of claim 8 further comprising the step of:

progressively increasing the power supplied to the target throughout the useful life of the of the target as the first sputtering region of the target erodes.

11. The method of claim 10 wherein:

the power increasing step includes the step of increasing the power supplied to the target so as to maintain the predetermined rate at which material is deposited onto the substrate from the first sputtering region at an approximately constant level.

12. The method of claim 10 wherein:

the current reducing step includes the step of progressively reducing the current supplied to the electro magnet in response to the control signal to maintain the voltage at a generally constant level.

* * * * *

UNITED STATES PATENT AND TRADEMARK OFFICE
CERTIFICATE OF CORRECTION

PATENT NO. : 5,174,875
DATED : December 29, 1992
INVENTOR(S) : Steven D. Hurwitt, et. al.

It is certified that error appears in the above-indentified patent and that said Letters Patent is hereby corrected as shown below:

Column 17, line 25, "target erodes at the firs sputtering" should be -- target erodes at the first sputtering --.

Signed and Sealed this

Twenty-second Day of February, 1994

Attest:

BRUCE LEHMAN

*Attesting Officer*       *Commissioner of Patents and Trademarks*